US011626183B2

United States Patent
Bordia et al.

(10) Patent No.: US 11,626,183 B2
(45) Date of Patent: Apr. 11, 2023

(54) METHOD AND STORAGE SYSTEM WITH A NON-VOLATILE BAD BLOCK READ CACHE USING PARTIAL BLOCKS

(71) Applicant: Western Digital Technologies, Inc., San Jose, CA (US)

(72) Inventors: Kalpit Bordia, Karnataka (IN); Gautam Dusija, Burlingame, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 58 days.

(21) Appl. No.: 17/397,245

(22) Filed: Aug. 9, 2021

(65) Prior Publication Data

US 2023/0045156 A1 Feb. 9, 2023

(51) Int. Cl.
| G11C 29/42 | (2006.01) |
| G11C 16/34 | (2006.01) |
| G11C 29/00 | (2006.01) |
| G11C 29/44 | (2006.01) |

(52) U.S. Cl.
CPC .......... *G11C 29/42* (2013.01); *G11C 16/3495* (2013.01); *G11C 29/4401* (2013.01); *G11C 29/765* (2013.01)

(58) Field of Classification Search
CPC . G11C 29/42; G11C 16/3495; G11C 29/4401; G11C 29/765
See application file for complete search history.

(56) References Cited

U.S. PATENT DOCUMENTS

| 10,008,250 | B2 * | 6/2018 | Ramalingam | G11C 11/5628 |
| 10,049,047 | B1 * | 8/2018 | Kotte | G06F 12/0246 |
| 10,734,079 | B1 * | 8/2020 | Seetharaman | G06F 9/5077 |
| 10,950,292 | B1 * | 3/2021 | Seyedzadeh | G11C 11/4078 |
| 11,036,582 | B2 * | 6/2021 | Gopalakrishnan | G11C 29/38 |
| 11,256,620 | B1 * | 2/2022 | Brandt | G06F 12/0802 |
| 2015/0149693 | A1 * | 5/2015 | Ng | G11C 11/5628 711/103 |
| 2016/0092129 | A1 * | 3/2016 | Agarwal | G11C 29/4401 714/764 |
| 2016/0259570 | A1 * | 9/2016 | Agarwal | G11C 29/76 |
| 2022/0319622 | A1 * | 10/2022 | Bhardwaj | G11C 29/42 |

* cited by examiner

*Primary Examiner* — Tuan T Nguyen
(74) *Attorney, Agent, or Firm* — Crowell & Moring LLP

(57) ABSTRACT

A storage system has a memory with a multi-level cell (MLC) block and a partially-bad single-level cell (SLC) block. The storage system repurposes the partially-bad SLC block as a non-volatile read cache for data stored in the MLC block (e.g., cold data that is read relatively frequently) to improve performance of host reads. Because the original version of the data is still stored in the MLC block, the original version of the data can be read if there is an error in the copy of the data stored in the partially-bad SLC block, thus avoiding the need for extensive error-correction handling to account for the poor reliability of the partially-bad SLC block.

18 Claims, 12 Drawing Sheets

METHOD AND STORAGE SYSTEM WITH A NON-VOLATILE BAD BLOCK READ CACHE USING PARTIAL BLOCKS

BACKGROUND

A memory of a storage system comprises a plurality of blocks of memory cells. Some of these blocks may have problems with storing data reliably, such as when a block has word lines that are not functioning properly ("bad word lines"). Such blocks are often referred to as "bad blocks." In some cases, a bad block is marked in the manufacturing process as unavailable for use. However, a bad block may still be able to store data to a certain extent, albeit not as reliably as a "good block." Such blocks are often referred to as "partially-bad blocks." Some storage systems use partially-bad blocks to store data but provide extensive error-correction handling to account for the poor reliability of the blocks.

DETAILED DESCRIPTION

The following embodiments are generally related to a method and storage system with a non-volatile bad block read cache using partial blocks. In one embodiment, a storage system is provided comprising a memory comprising a multi-level cell (MLC) block and a partially-bad single-level cell (SLC) block and a controller. The controller is configured to copy data stored in the MLC block into the partially-bad SLC block, wherein the data is stored both in the MLC block and the partially-bad SLC block; receive a request from a host to read the data; and read the data from the partially-bad SLC block instead of the MLC block. In another embodiment, a method is provided for used in a storage system comprising a memory comprising a multi-level cell (MLC) block and a partially-bad single-level cell (SLC) block configured for use as a read cache. The method comprises identifying data stored in the MLC block to be copied into the read cache; storing a copy of the data in the read cache; receiving a request from a host to read the data; and in response to the request, reading the copy of the data from the read cache. In yet another embodiment, a storage system is provided comprising a memory and means for repurposing a partially-bad SLC block in the memory as a non-volatile read cache for data stored in a multi-level cell (MLC) block in the memory. Other embodiments are provided, and each of these embodiments can be used alone or in combination.

Figure 1A:
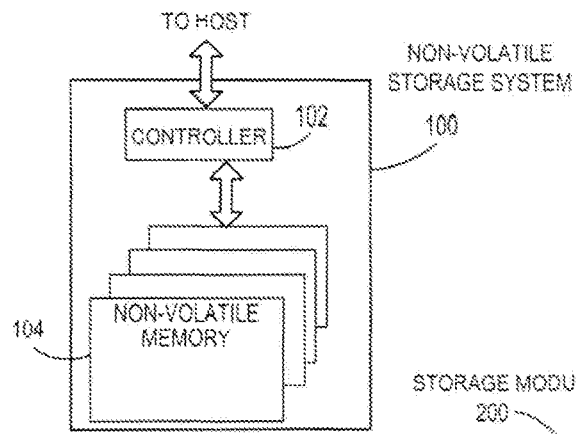
FIG. 1A is a block diagram of a non-volatile storage system of an embodiment.
Figure 1B:
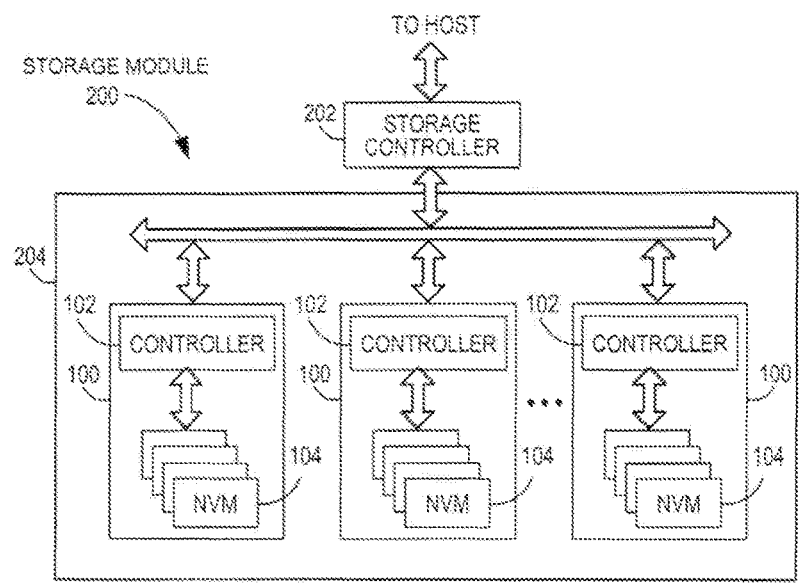
FIG. 1B is a block diagram illustrating a storage module of an embodiment.
Figure 1C:
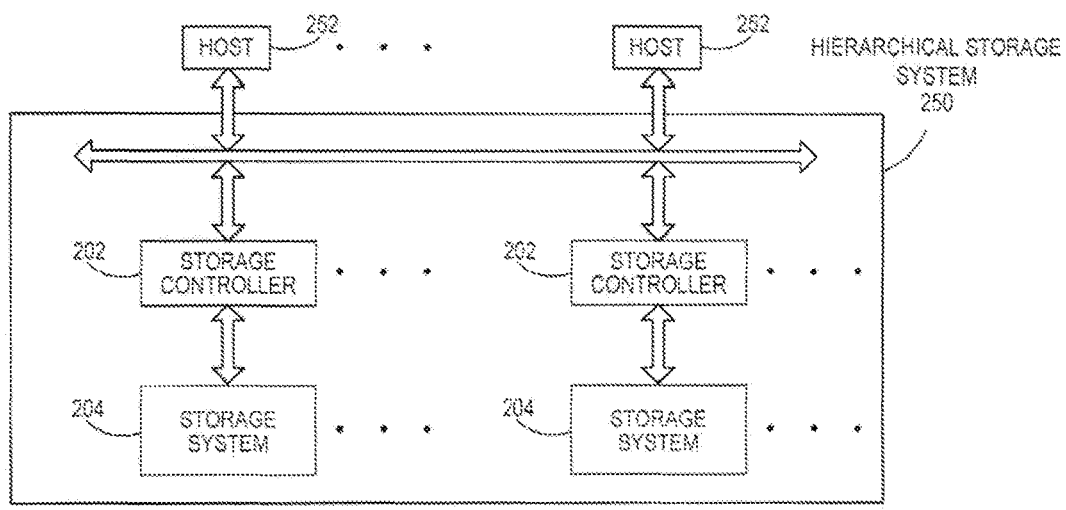
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
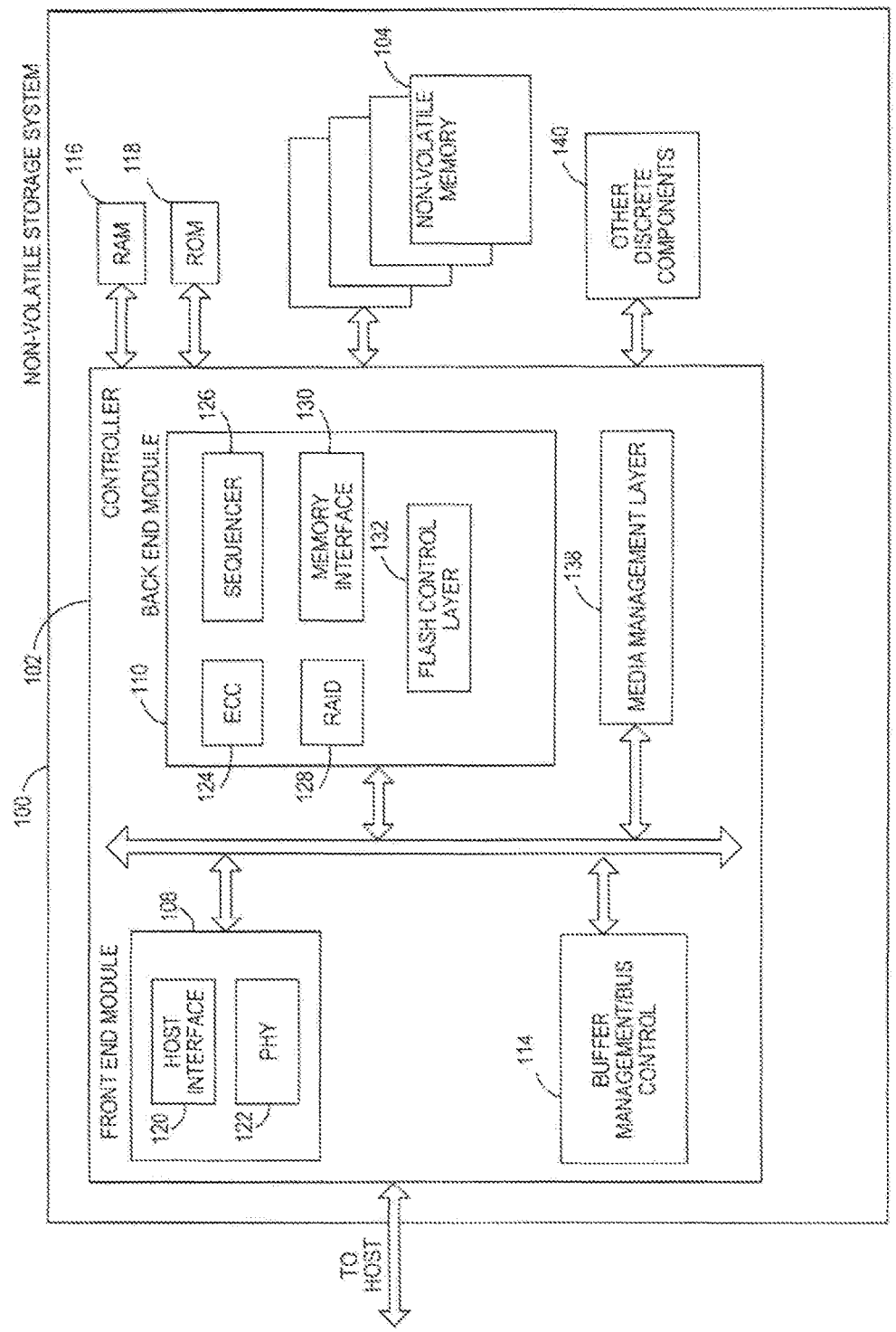
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
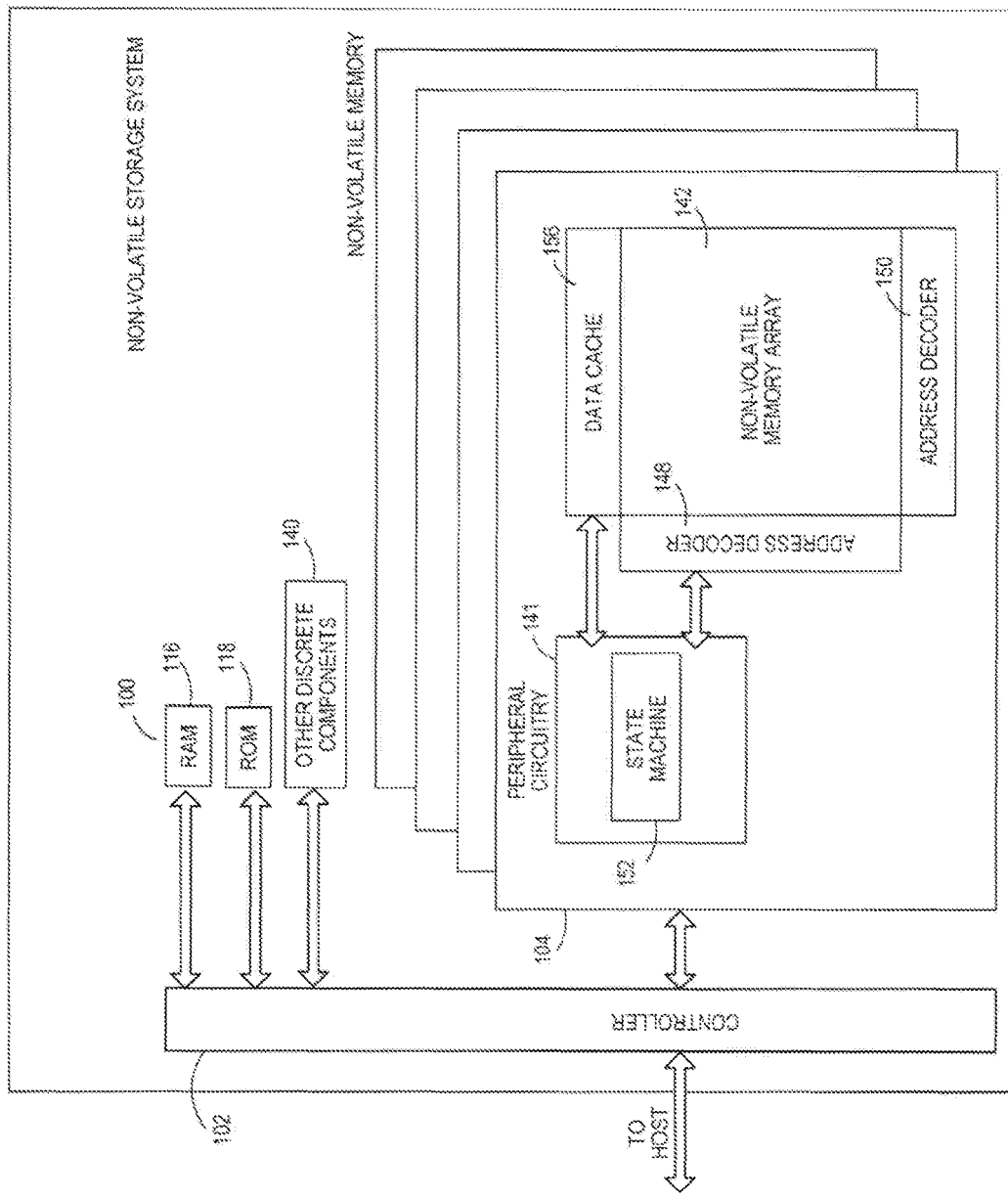
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
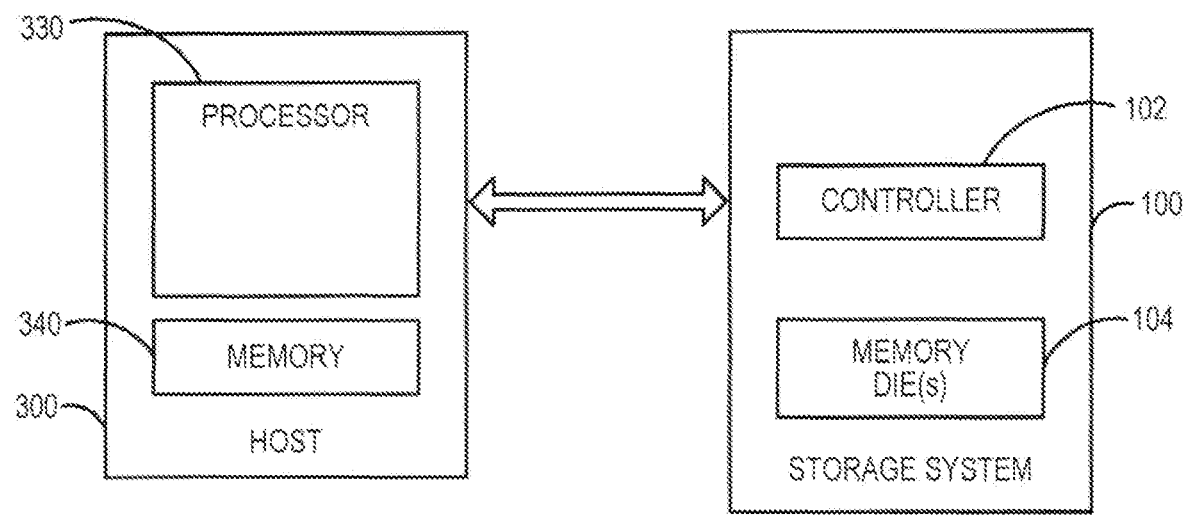
FIG. 3 is a block diagram of a host and a storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340) to the storage system 100 for storage in the storage system's memory 104.

Figure 4:
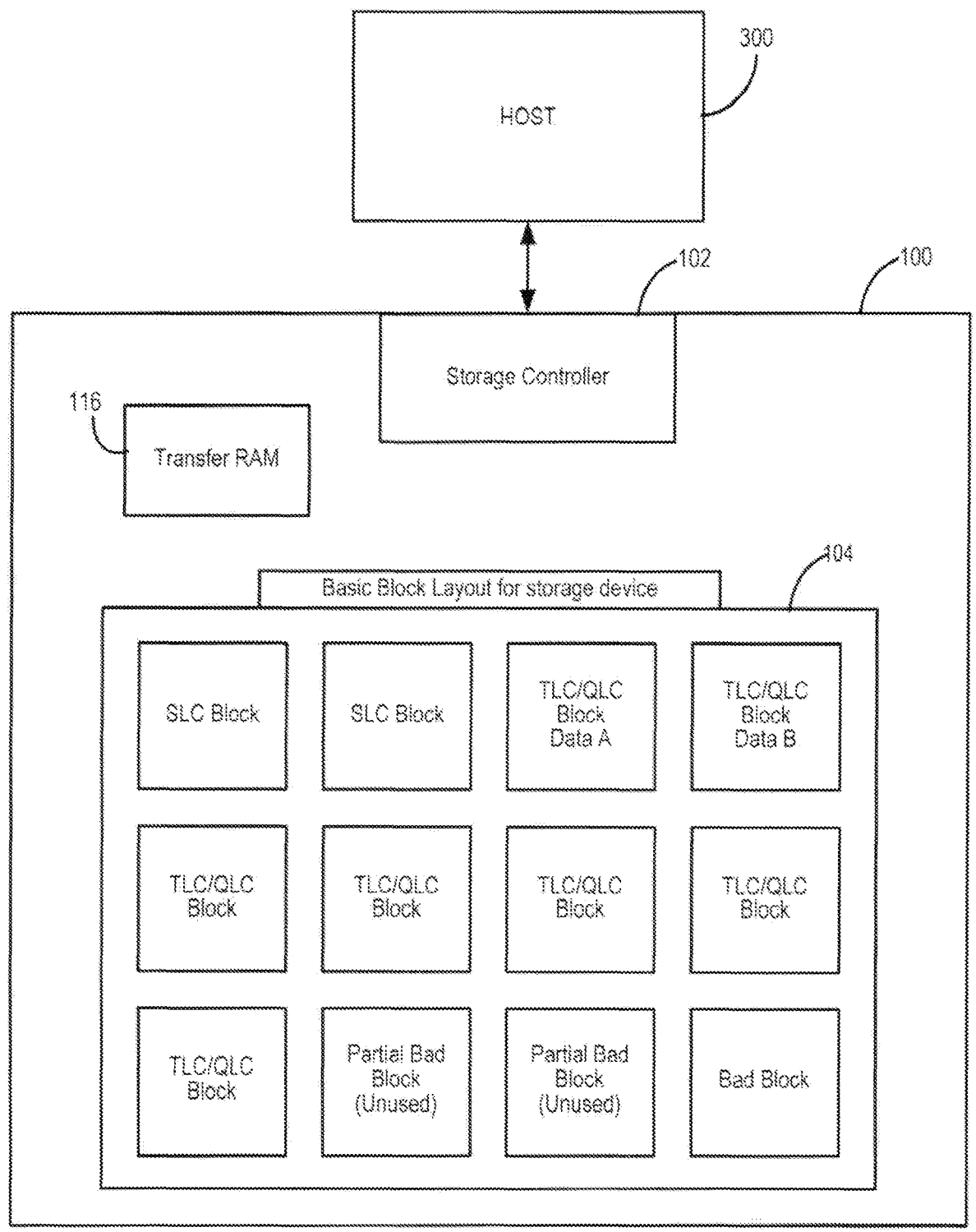
FIG. 4 is a block diagram of a host and a storage system of an embodiment showing a basic memory block layout.

FIG. 4 is a block diagram showing a basic block layout of the memory 104 in one embodiment. As shown in FIG. 4, the memory 104 comprises a plurality of blocks of memory cells. Some blocks are configured as single-level cell (SLC) blocks, and other blocks are configured as multi-level cell (MLC) blocks, such as triple-level cell (TLC) blocks and quad-level cell (QLC) blocks. In general, SLC blocks provide faster read performance than MLC blocks, whereas MLC blocks have a large storage capacity than SLC blocks. In one embodiment, SLC blocks are used to store data in burst mode, where data is quickly coming into the storage system 100 for storage (e.g., when a user holds down the shutter button on a camera application on a mobile device), and the data is later moved from the SLC blocks to MLC blocks for longer-term storage.

As shown in FIG. 4, some of the blocks are designated as "bad" or "partial bad" blocks. As noted above, if a block has problems storing data reliably, such as when a block has word lines that are not functioning properly ("bad word lines"), the block can be marked as "bad" during the manufacturing process and made unavailable for use. There are many reasons why a block may not be functioning properly. For example, with various new developments in NAND technology, it is observed that as the nodes are transitioned, the physical block sizes grow with each node. While the block sizes have increased rapidly, the defect rate in terms of percentage of blocks per plane have not improved considerably, which means that a significant portion of the blocks are not being utilized due to process defects.

Among these bad blocks, not all blocks are completely bad and can still be partially used to store data. A bad block that is able to store data to a certain extent, albeit not as reliably as a "good block," is often referred to as "partial bad block" (the terms "partial bad block," "partially-bad block," and "partially-usable block" will be used interchangeably herein). Partially-bad blocks can be identified in any suitable way. For example, a differential memory screen can be defined for this purpose or special-purpose production firmware can be used that is targeted to identify such blocks with basic write/read/compare cycles (to detect partial word lines that can be utilized). The pool of partially-bad blocks can be maintained separately by the controller 102 (e.g., using firmware). Each memory can be a different number of partially-bad blocks that the controller can maintain. It should be noted that instead of or in addition to partially-bad blocks being identified during the manufacturing process, the blocks can be identified during runtime (e.g., good blocks can become bad or partially-bad over time).

Concerns remain on reliability of data stored in such blocks over the long term due to process impact, and this concern is compounded when exposed to high erase cycles, and blocks can go bad in the field. As such, using partially-bad blocks may be not desirable or even feasible for client (e.g., original equipment manufacturer (OEM)) or enterprise applications where reliability is a major criterion. Even if partially-bad blocks were used for shorter-term data, such as control data, some kind of redundancy or extensive exception handling/error-correction handling algorithms may be desired to ensure that the blocks can be used intermittently. Long-term reliability issues would remain the longer the data is stored. Further, using exception handling mechanisms can result in a decrease in performance for the storage system.

As illustrated by the above examples, reliability of data in partially-bad blocks is a major concern and can be a deterrent to their usage in many client/OEM/enterprise use-cases, and the need for additional error handling mechanisms can nullify the actual gains of using such blocks.

The following embodiments provide a new use for the partially-bad blocks in the memory 104 that avoids these issues. In one embodiment, partially-bad blocks are used as a read cache for data that is already stored in another block in the memory 104. In one particular implementation, the partially-bad block has a faster read access time than the good block storing the data, such as when the partially-bad block is an SLC block, and the good block is an MLC block. So, by storing a copy of the data in the faster, partially-bad block, the data can be read more quickly than from the slower, good block. This provides for improved host read performance in multiple scenarios which would have otherwise had slower MLC read performance. And because the original data is still stored in the good block, if an error occurs in reading the partially-bad block, the data can simply be read from the good block. This avoids the need for using extensive error-handling with the partially-bad block.

The following paragraphs provide several examples uses of these embodiments. It should be understood that these are merely examples and other implementations can be used.

Figure 5:
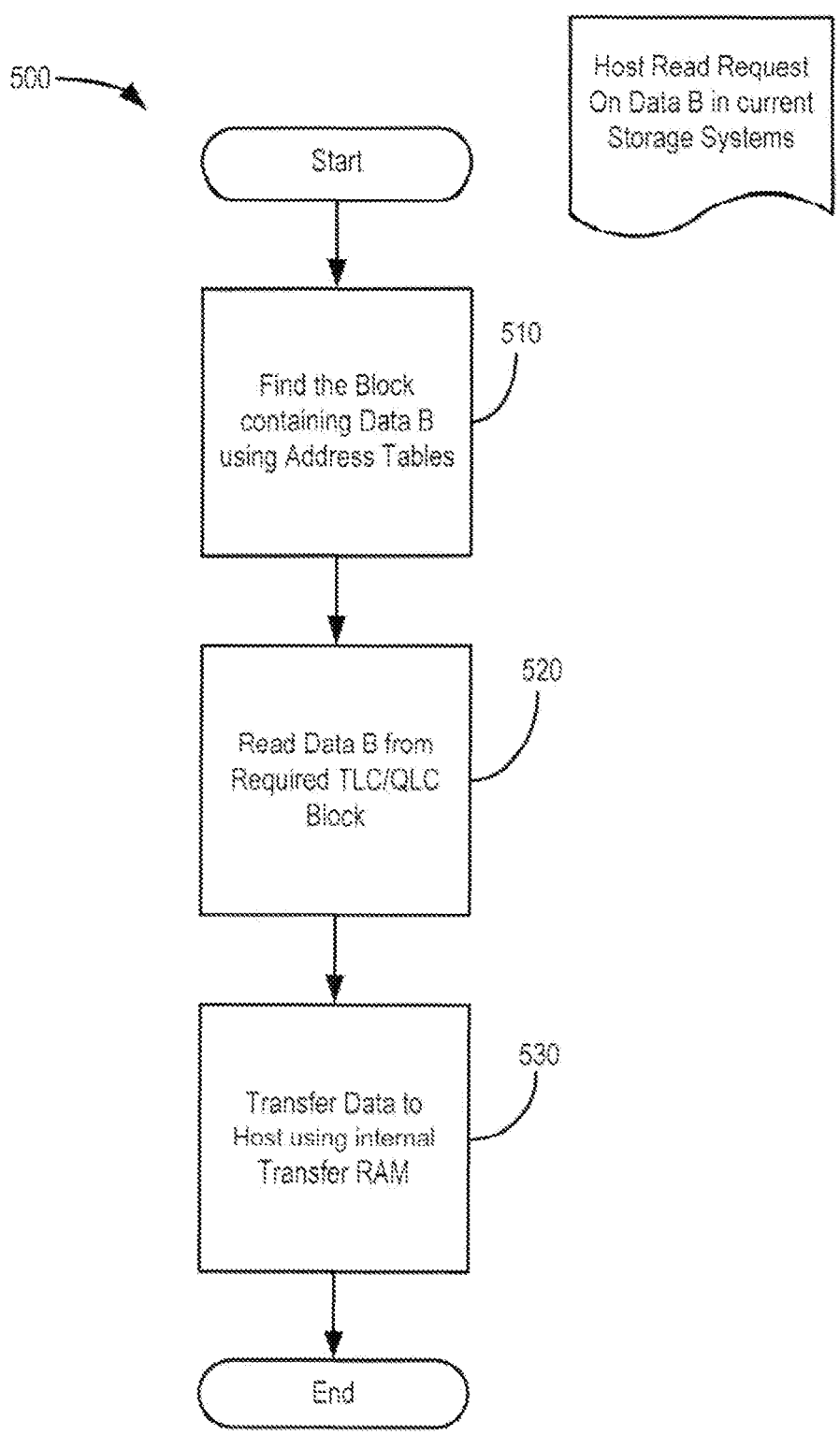
FIG. 5 is a flow chart of a read operation of an embodiment.

Turning again to the drawings, FIG. 5 is a flow chart of read operation for the "base case" situation illustrated in FIG. 4 where partially-bad blocks in the memory 104 are not used. In this example, "Data B" is stored in a good block in the memory 104, which is an MLC (e.g., TLC/QLC) block. As shown in FIG. 5, when the storage system 100 receives a read request from the host 300 for Data B stored in a particular logical address, the controller 102 uses a logical-to-physical address table or map to find the physical address of the memory block in the memory 104 that corresponds with the logical address (act 510). The controller 102 then reads the data from the memory block (act 520) and transfers the data to the internal transfer RAM 116 (see FIG. 4) in the memory (act 530). From there, the data is returned to the host 300.

In this example, the data is stored in an MLC block instead of an SLC block. This may be because the data was considered to be "cold" (e.g., due to a lack of host updates or some other criterion that indicates the data is not updated or accessed above a threshold number of times). In general, for performance reasons, the controller 102 may want to store "hot" (frequently updated/accessed) data in SLC blocks because those blocks are read faster than MLC blocks. However, SLC blocks are in limited supply. So, when the controller 102 determines that data is cold, it can move the data to the slower MLC block.

However, there are situations in which the data, although not "hot enough" to be stored in an SLC block, is still accessed somewhat frequently (e.g., above a threshold number of times) and, thus, is a good candidate to move to a faster SLC cache. For example, even with the introduction of a hybrid-blocks algorithm allowing MLC blocks to be used as SLC, there remains multiple use-cases which are real user-scenarios (e.g., boot operating system (Boot-OS) or frequently-loaded read-only data) where host data goes cold and is moved to MLC but is still read quite frequently. Considering a typical QLC use case with NAND memory, QLC sense can be three-times more time consuming as compared to SLC sense. To address this issue, the data can be copied to a partially-bad SLC block. Any suitable mechanism can be used to identify data to be stored in the cache. For example, the controller 102 can use pre-existing heuristics to identify cold data with additional read counter mapping. As another example, caching of certain data can be triggered by a host communication/information. Any other algorithm to identify the data set can be used.

Figure 6:
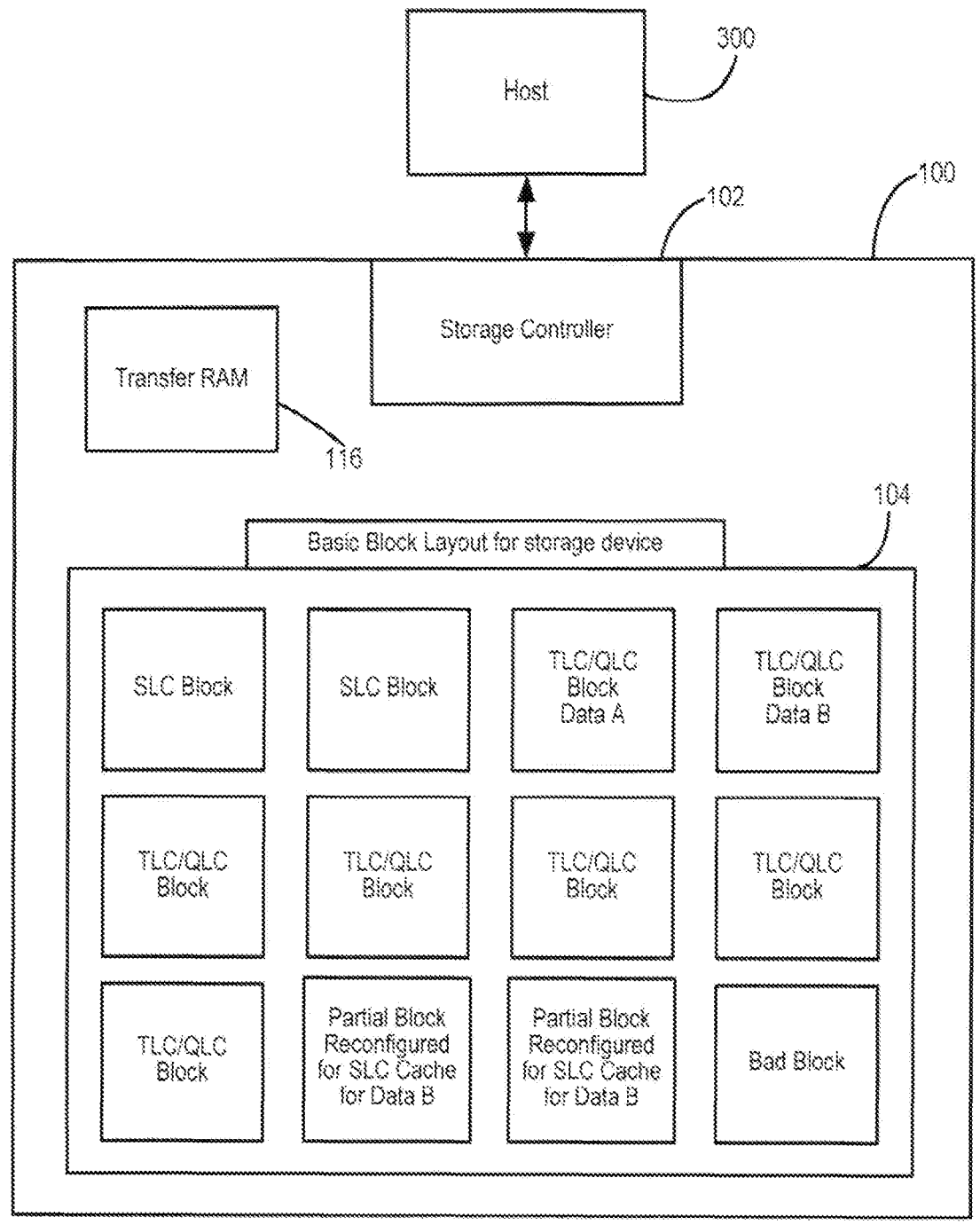
FIG. 6 is a block diagram of a host and a storage system of an embodiment in which a partially-bad block is reconfigured as a read cache.
Figure 7:
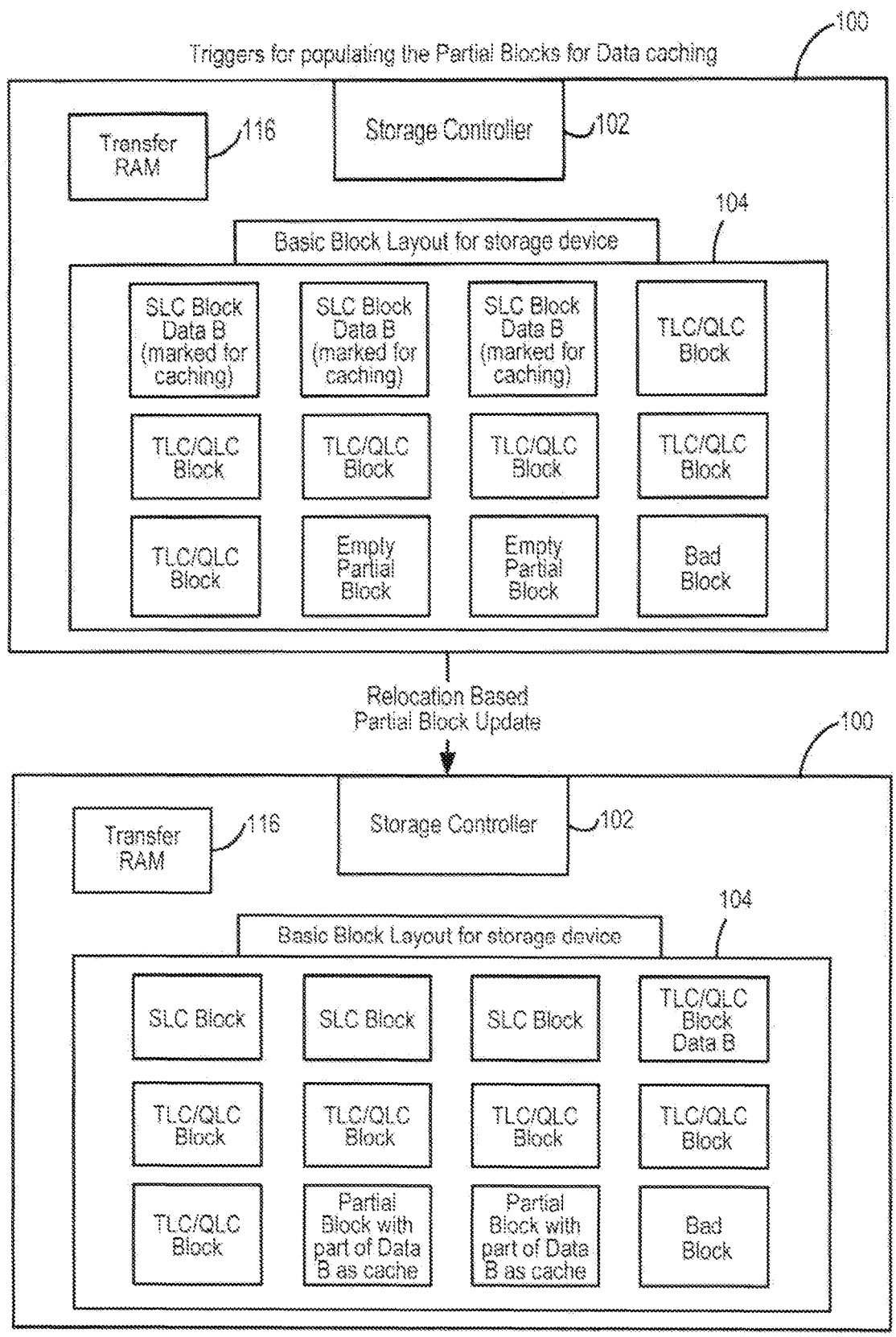
FIG. 7 is a block diagram of a host and a storage system of an embodiment showing triggers for populating partial blocks for data caching.

As shown in FIG. 6, in this embodiment, the read cache is formed from partially-bad blocks. As shown in FIG. 7, data can be marked for caching and then copied to partially-bad blocks. When data is copied to the partially-bad block, a write error may occur (e.g., due to a bad word line), in which case, the controller 102 can skip the bad word line and find a good word line in the block to use. The copying can be done in any suitable way. For example, having identified the data and available cache, the controller 102 can utilize a background operation (BKOPS) as a way to copy the data to the partially-bad block and allow a bit as part of control data to allow detection and availability of the data in the cache.

In this way, a read can be serviced from the partially-bad block instead of from the MLC block, but the MLC block would still store the original data. Instead of doing the copying as a background operation, the copying can be done as a foreground operation based on a combination of multiple criteria (e.g., when the host 300 has crossed certain read thresholds on MLC blocks without overwrites on that block, when cache space is available, when the program-erase count (PEC) of the cache block being significantly low, etc.).

When a request comes in for the data, the data can be read from the faster partially-bad SLC block instead of the slower MLC block. And because the data is still stored in the MLC block, if there is an error reading the partially-bad SLC block, the data can simply be read from the MLC block. That is, since the partially-bad blocks in this embodiment are just used as a cache, the partially-bad blocks do not need to guarantee reliability or use extensive exception-handling mechanisms. Additionally, considering a typical QLC use case with NAND memory, by caching the read data in a partially-bad SLC block, QLC read disturb is reduced. This reduction will reduce the QLC read scrub rate (depending on the use case, as data retention type of read scrub is not saved) and, thus, save a few QLC program-erase (PE) cycles, which can now be used for hybrid and improve performance as well.

Figure 8:
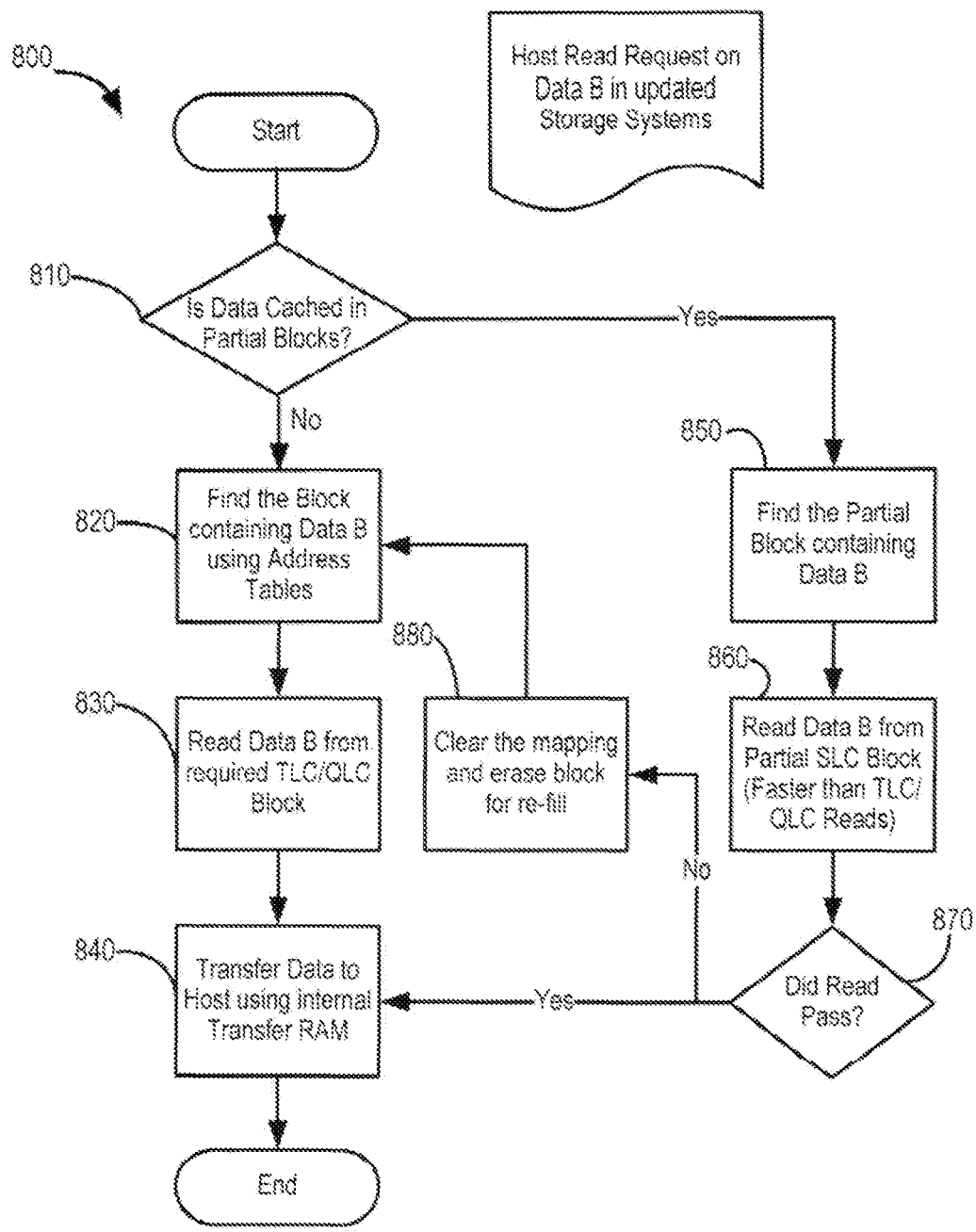
FIG. 8 is a flow chart of a read operation of an embodiment.

FIG. 8 shows a flow chart 800 for reading data from the read cache in this embodiment. As shown in FIG. 8, when the storage system 100 receives a read command with the logical block address of Data B, the controller 102 in the storage system 100 determines if the data is cached in a partially-bad block (act 810). If the data is not cached in a partially-bad block, the data is read from the MLC block (acts 820-840), similar to the process illustrated in FIG. 5. However, if the data is cached in a partially-bad block, the controller 102 find the partially-bad block that corresponds to the good block that stores the original version of the data (act 850). This can be done in any suitable way. For example, the controller 102 can create a mapping (in the logical-to-physical address table or elsewhere) between a good MLC block and a partially-bad SLC block. That way, the controller 102 can redirect the read operation from the MLC block to the partially-bad SLC block, so that the partially-bad SLC block is read instead of the MLC block (act 860).

Because the partially-bad SLC block is not completely reliable, it is possible that the data read from the partially-bad SLC block contains errors. So, in this embodiment, the controller 102 determines if the read passes an error detection/correction check (act 870). For example, if the number of errors in the data is zero or below a threshold, the data is can be returned to the host 300 (act 840). Otherwise, the controller 102 can clear the mapping, erase the partially-bad block, and read the data from the good block (act 880). That is, in this embodiment, the data is still maintained in the MLC block after a copy of the data is stored in the partially-bad block, so the original data can simply be read from the MLC block, thereby avoiding the need for extensive error correction handling.

There are many alternatives that can be used with these embodiments. For example, the controller 102 can utilize host-based hints more effectively to have a non-volatile cache and allow better performance as compared to any regular device for such cases. Additionally, there is no data-reliability concern since it is just a cache of the data, and the actual data is stored in a good block. Also, program-erase (PE) cycling of partially-bad blocks can be limited due to the cold nature of data and can be artificially restricted as well. Further, a program-erase count (PEC) cycles of MLC blocks can be saved, giving hybrid usage some additional PEC. Additionally, growth of bad regions in these blocks will be maintained as well until the partial good part is low enough to reduce gains.

Figure 9:
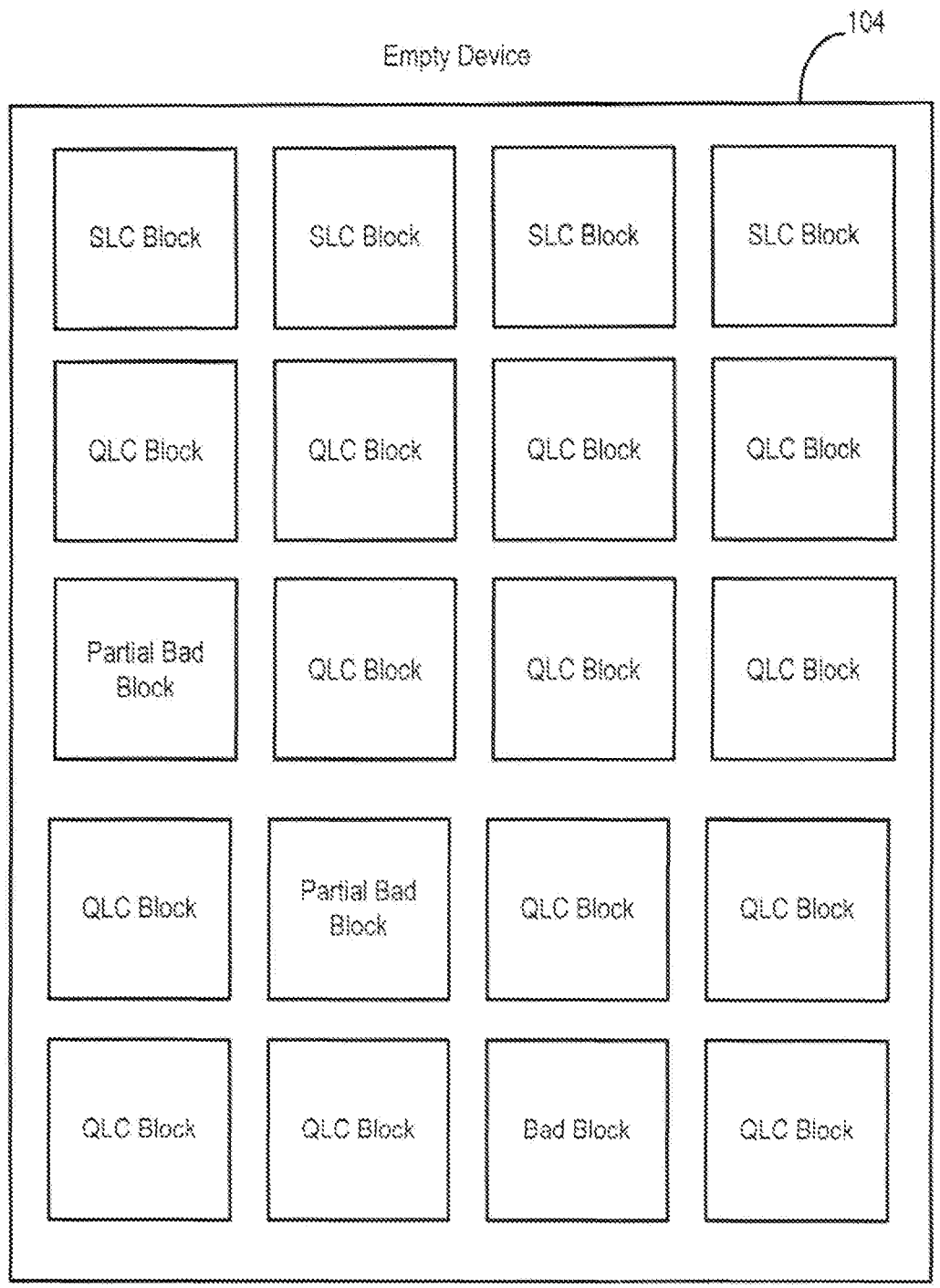
FIG. 9 is a block diagram of an empty memory of a storage system of an embodiment.
Figure 10:
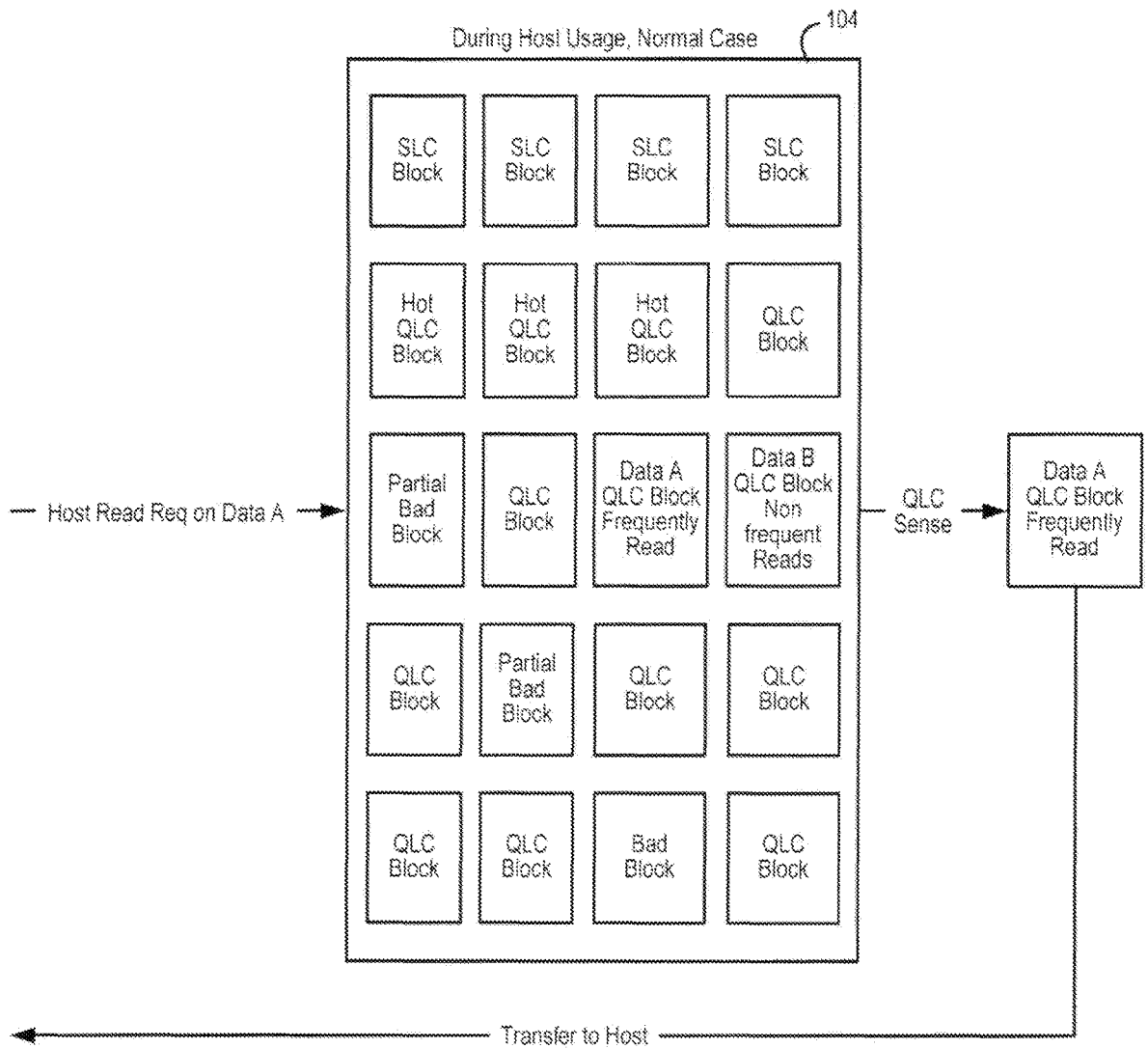
FIG. 10 is a block diagram of a memory of an embodiment during normal host usage.
Figure 11:
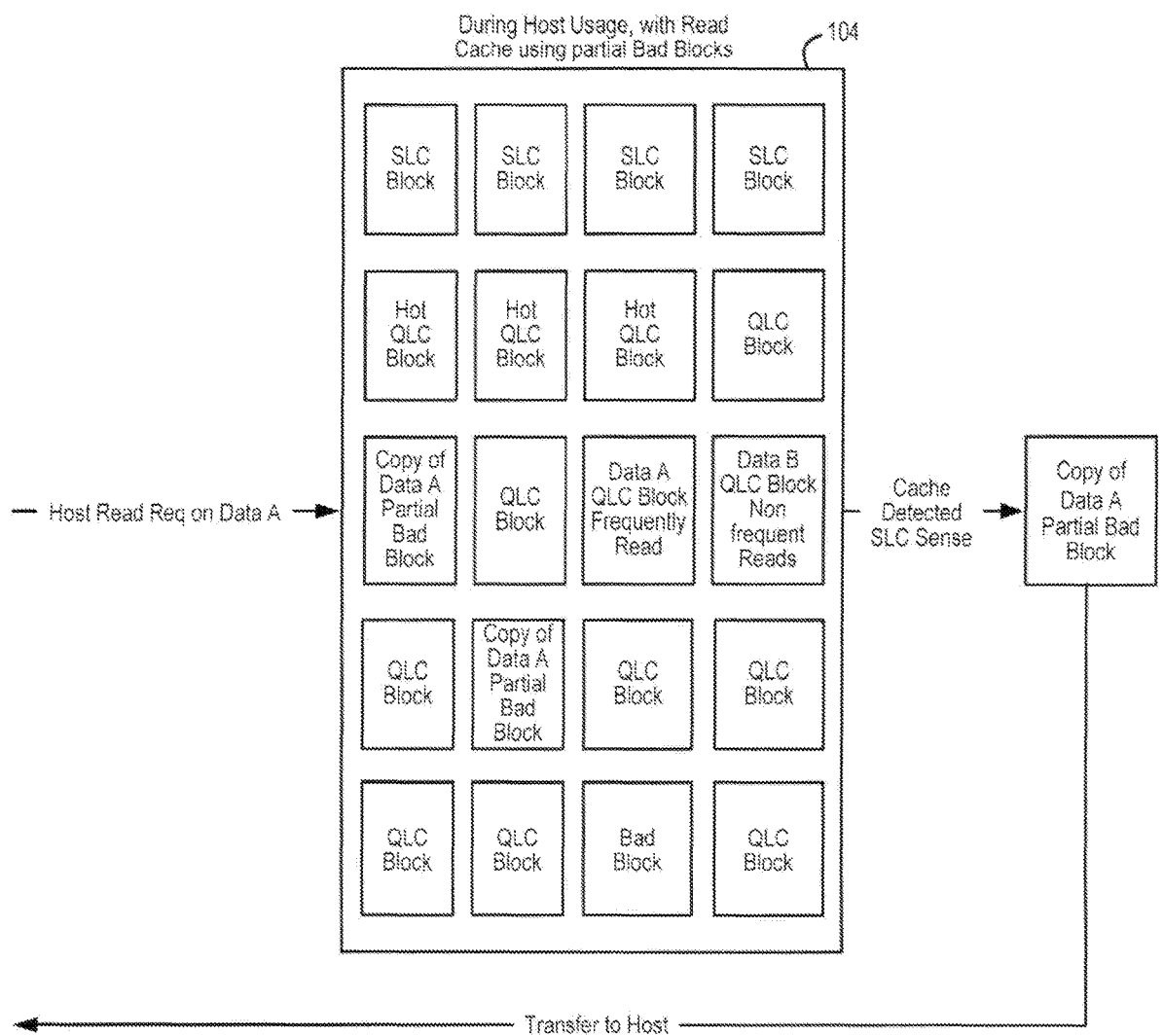
FIG. 11 is a block diagram of a memory of an embodiment when partially-bad blocks are used as a read cache.

There are several advantages associated with these embodiments. In general, these embodiments provide a unique approach and simple design of utilizing partially-bad blocks with high potential of performance gains, while addressing reliability concerns on these blocks. Current client SSD devices do not have any partial bad block handling. Hence, they are part of a bad block pool that is utilized since, even with known approaches, reliability remains a major concern due to unpredictability in the NAND behavior across various scenarios for bad blocks. With these embodiments, partially-bad blocks can be used for enhanced host read performance for the host operation system or host-application-specific caching, which are typically read only; hence, greatly improving the user-experience. This advantage is illustrated in FIGS. 9-11. FIG. 9 shows the configuration of the memory blocks in an empty memory 104. After normal usage, Data A and Data B are stored in QLC blocks (see FIG. 10). In this example, Data A is frequently read, but Data B is not. So, improvement in read performance for Data A can be achieved using these embodiments. More specifically, as shown in FIG. 11, a copy of Data A can be stored in a partially-bad block, and that copy can be read when the host requests a read of Data A.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:

1. A storage system comprising:
   a memory comprising a multi-level cell (MLC) block and a partially-bad single-level cell (SLC) block; and
   a controller configured to:
      copy data stored in the MLC block into the partially-bad SLC block, wherein the data is stored both in the MLC block and the partially-bad SLC block;
      receive a request from a host to read the data; and
      read the data from the partially-bad SLC block instead of the MLC blocks;
      determine if an error exists in the data read from the partially-bad SLC block;
      in response to determining that an error does not exist in the data read from the partially-bad SLC block, return the data read from the partially-bad SLC block to the host and
      in response to determining that an error exists in the data read from the partially-bad SLC block, read the data from the MLC block and return the data read from the MLC block to the host.

2. The storage system of claim 1, wherein the controller is further configured to create a mapping between the MLC block and the partially-bad SLC block, so that the data is read from the partially-bad SLC block instead of the MLC block in response to receiving the request from the host.

3. The storage system of claim 2, wherein the controller is further configured to clear the mapping between the MLC block and the partially-bad SLC block in response to determining that an error exists in the data read from the partially-bad SLC block.

4. The storage system of claim 1, wherein the controller is further configured to copy the data stored in the MLC block into the partially-bad SLC block in response to information received from the host.

5. The storage system of claim 1, wherein the controller is further configured to determine that the data stored in the MLC block should be copied to the partially-bad SLC block by identifying the data as cold data that was read more than a threshold number of times.

6. The storage system of claim 1, wherein the controller is further configured to copy the data as a background operation.

7. The storage system of claim 1, wherein the controller is further configured to copy the data in response to determining that a program-erase count of the partially-bad SLC block is below a threshold.

8. The storage system of claim 1, wherein the memory comprises a three-dimensional memory.

9. In a storage system comprising a memory comprising a multi-level cell (MLC) block and a partially-bad single-level cell (SLC) block configured for use as a read cache, a method comprising:
   identifying data stored in the MLC block to be copied into the read cache;
   storing a copy of the data in the read cache;
   receiving a request from a host to read the data;
   in response to the request, reading the copy of the data from the read cache;
   performing an error check on the copy of the data read from the read cache; and
   in response to the copy of the data read from the read cache passing the error check, returning the copy of the data to the host.

10. The method of claim 9, wherein identifying the data comprises determining that the data is cold data but is associated with a read counter having a count above a threshold value.

11. The method of claim 9, wherein identifying the data comprises determining that a read threshold on the MLC block has been exceeded without an overwrite to the MLC block.

12. The method of claim 9, wherein the data is identified based on a host communication.

13. The method of claim 9, further comprising:
   in response to the copy of the data read from the read cache failing the error check, reading the data from the MLC block and returning the data read from the MLC block to the host.

14. The method of claim 13, further comprising:
   in response to the copy of the data read from the read cache failing the error check, removing a mapping between the MLC block and the read cache.

15. The method of claim 9, wherein the copy of the data is stored as a background operation.

16. The method of claim 9, wherein the copy of the data is stored in response to a determination that the read cache has capacity to store the copy of the data.

17. The method of claim 9, wherein the copy of the data is stored in response to a determination that a program-erase count (PEC) of the read cache is below a threshold.

18. A storage system comprising:
a memory comprising a multi-level cell (MLC) block and a partially-bad single-level cell (SLC) block;
means for copying data stored in the MLC block into the partially-bad SLC block, wherein the data is stored both in the MLC block and the partially-bad SLC block;
means for receiving a request from a host to read the data; and
means for reading the data from the partially-bad SLC block instead of the MLC block;
means for performing an error check on the copy of the data read from the read cache; and
means for returning the copy of the data to the host in response to the copy of the data read from the read cache passing the error check.

* * * * *